US012772575B2

(12) United States Patent
Becker et al.

(10) Patent No.: US 12,772,575 B2
(45) Date of Patent: Oct. 20, 2026

(54) INTERFACE PREPARATION FOR TANDEM PHOTOVOLTAIC DEVICES

(71) Applicant: First Solar, Inc., Tempe, AZ (US)

(72) Inventors: James Becker, Perrysburg, OH (US); Vinodh Chandrasekaran, Perrysburg, OH (US); Casimir Kotarba, Ann Arbor, MI (US); Andrei Los, Perrysburg, OH (US); Jialiu Ma, Perrysburg, OH (US)

(73) Assignee: First Solar, Inc., Phoenix, AZ (US)

( * ) Notice: Subject to any disclaimer, the term of this patent is extended or adjusted under 35 U.S.C. 154(b) by 0 days.

(21) Appl. No.: 18/710,094

(22) PCT Filed: Nov. 16, 2022

(86) PCT No.: PCT/US2022/050169
§ 371 (c)(1),
(2) Date: May 14, 2024

(87) PCT Pub. No.: WO2023/091530
PCT Pub. Date: May 25, 2023

(65) Prior Publication Data

US 2025/0015218 A1 Jan. 9, 2025

Related U.S. Application Data

(60) Provisional application No. 63/419,182, filed on Oct. 25, 2022, provisional application No. 63/309,885, (Continued)

(51) Int. Cl.
*H10F 10/161* (2025.01)
*H10F 77/20* (2025.01)
*H10F 77/70* (2025.01)

(52) U.S. Cl.
CPC ......... *H10F 10/161* (2025.01); *H10F 77/244* (2025.01); *H10F 77/703* (2025.01); *H10F 77/251* (2025.01)

(58) Field of Classification Search
CPC ..... H10F 10/161; H10F 77/703; H10F 77/244
See application file for complete search history.

(56) References Cited

U.S. PATENT DOCUMENTS 1,033,016 A 7/1912 Hope
8,982,434 B2 3/2015 Uchida
(Continued)

FOREIGN PATENT DOCUMENTS

EP 0659910 6/1995
EP 2413373 A1 2/2012
(Continued)

OTHER PUBLICATIONS

Japanese Office Action, dated May 29, 2025, Application No. 2024-529204.
(Continued)

*Primary Examiner* — Lindsey A Buck
(74) *Attorney, Agent, or Firm* — MacMillan, Sobanski & Todd, LLC

(57) ABSTRACT

Ways of making and using tandem photovoltaic devices are provided, where such devices can include a first submodule, a second submodule, and an interface between the first submodule and the second submodule. The interface permits a portion of light to pass therethrough and optically couples the first submodule and the second submodule. Optically coupling the first submodule and the second submodule includes reducing reflection of the portion of light passing through the interface.

19 Claims, 8 Drawing Sheets

Related U.S. Application Data filed on Feb. 14, 2022, provisional application No. 63/279,962, filed on Nov. 16, 2021.

(56) References Cited

U.S. PATENT DOCUMENTS

| | | | | |
|---|---|---|---|---|
| 10,672,930 | B2 | 6/2020 | Mishima et al. | |
| 11,820,928 | B2 | 11/2023 | Rand et al. | |
| 12,063,799 | B2 | 8/2024 | Hiraoka et al. | |
| 12,206,037 | B2 | 1/2025 | Gloeckler et al. | |
| 12,336,321 | B2 | 6/2025 | Bourgeois et al. | |
| 2005/0012095 | A1 | 1/2005 | Niira et al. | |
| 2014/0273334 | A1 * | 9/2014 | Christensen .......... | H10F 71/125 438/94 |
| 2018/0175112 | A1 * | 6/2018 | Robinson ............... | H10K 85/50 |
| 2019/0296174 | A1 | 9/2019 | Gloeckler et al. | |

FOREIGN PATENT DOCUMENTS

| | | | |
|---|---|---|---|
| GB | 2559800 | | 8/2018 |
| JP | 200557251 | | 3/2005 |
| JP | 201186731 | | 10/2009 |
| JP | 2012114296 | | 6/2012 |
| JP | 2019523740 | | 8/2019 |
| JP | 2019530984 | | 10/2019 |
| JP | 2020161546 | | 10/2020 |
| JP | 2020161546 | A | 10/2020 |
| WO | 2013054633 | | 4/2013 |
| WO | 2016157979 | | 10/2016 |
| WO | 2017057646 | | 4/2017 |
| WO | 2020120991 | A1 | 6/2020 |
| WO | 2020240947 | | 12/2020 |

OTHER PUBLICATIONS

European Office Action, dated May 14, 2025, Application No. 22839031.6.

PCT International Search Report and Written Opinion, Application No. PCT/US2022/050169, mailed Mar. 29, 2023.

Japanese Notification of Reason(s) for Rejection, Application No. 2024-529204, dated Nov. 1, 2024.

European Communication pursuant to Article 94(3), Application No. 22 839 031.6, dated Nov. 6, 2024.

Intellectual Property of India, Examination Report, dated Jan. 21, 2026, Application No. 202417038163.

Japanese Notification of Decision of Rejection, dated Jan. 21, 2026, Application No. 2024-529204.

* cited by examiner

INTERFACE PREPARATION FOR TANDEM PHOTOVOLTAIC DEVICES

CROSS-REFERENCE TO RELATED APPLICATIONS

This is a national phase application of international application PCT/US2022/050169, filed on Nov. 16, 2022, and claims the benefit of U.S. Provisional Application No. 63/419,182 filed on Oct. 25, 2022, U.S. Provisional Application No. 63/309,885 filed on Feb. 14, 2022, and U.S. Provisional Application No. 63/279,962 filed on Nov. 16, 2021, each of which is incorporated by reference in the entirety.

FIELD

The present technology relates to photovoltaic devices and, more specifically, to ways of preparing an interface within tandem photovoltaic devices to minimize undesired reflections.

BACKGROUND

This section provides background information related to the present disclosure which is not necessarily prior art.

A photovoltaic device generates electrical power by converting light into electricity using semiconductor materials that exhibit the photovoltaic effect. Certain semiconductor materials are more efficient at absorbing particular ranges of the electromagnetic spectrum. To improve the overall efficiency of photovoltaic devices, the devices can incorporate stacked submodules, also referred to as subcells, utilizing semiconductor materials with differing absorptive properties to form a tandem photovoltaic device.

In an example tandem photovoltaic device, solar radiation or light enters through a top submodule and a portion of the radiation passes through the top submodule to a bottom submodule. The top submodule can absorb more higher-energy photons having a shorter wavelength, while the bottom submodule can absorb lower energy photons having a longer wavelength. An interface exists between the top submodule and the bottom submodule.

Laboratory experiments measuring absorption efficiency at relevant spectral ranges for separate submodules have shown that there are promising submodules that might be used together to absorb a greater proportion of incident radiation. However, with the increased complexity of a tandem architecture, it can also be challenging to close the gap between actual and theoretical performance. A substantial challenge for producing tandem photovoltaic devices, with good efficiency and manufacturability, is in providing an interface between submodules that has desired electrical, optical, physical, and thermal properties.

Accordingly, a need exists for ways to prepare the interface within tandem photovoltaic devices and for minimizing undesired reflections in the tandem photovoltaic device architecture.

SUMMARY

In concordance with the instant disclosure, the present technology provides articles of manufacture, systems, and processes that relate to ways of making and using tandem photovoltaic devices.

Tandem photovoltaic devices are provided that can include a first submodule, a second submodule, and an interface between the first submodule and the second submodule. The interface can permit a portion of light to pass therethrough and can therefore optically couple the first submodule and the second submodule. The optical coupling of the first submodule and the second submodule can include reducing reflection of the portion of light passing through the interface.

Certain embodiments of tandem photovoltaic devices can include the following aspects. The interface can include a first layer of the first submodule, where the first layer is adjacent the second submodule. The first layer can have a first surface having a roughness with a root mean square average of less than 170 nanometers. The interface can include a second layer of the first submodule, where the second layer is in contact with the first surface of the first layer. The second layer of the interface can be positioned between the first layer and the second submodule. The first layer and the second layer can have an index of refraction mismatch of at least 0.75. The first layer of the interface can include an absorber layer having a group II-VI semiconductor and the second layer can include a transparent layer. The second layer can include a conducting layer.

Certain embodiments of tandem photovoltaic devices can include the following aspects. The interface can include a first layer of the first submodule and a second layer of the first submodule. The first layer of the first submodule interface can be adjacent the second layer of the first submodule interface, where the first layer of the first submodule can have a first surface having a roughness with a root mean square average from about 50 nanometers to about 200 nanometers. The second layer of the first submodule can be in contact with the first surface of the first layer. The second layer of the first submodule can be positioned between the first layer of the first submodule and the second submodule, where the first layer of the first submodule and the second layer of the first submodule can have an index of refraction mismatch of less than 0.2. The second layer of the first submodule interface can include a first surface and a second surface, the first surface of the second layer can be in contact with the first surface of the first layer. The second surface of the second layer can have a roughness with a root mean square average of less than 170 nanometers. The first layer of the first submodule interface can include an absorber layer having a group II-VI semiconductor and the second layer can include a transparent layer. The transparent layer can include titanium dioxide.

Ways of making and using tandem photovoltaic devices are provided that include providing a first submodule and a second submodule and forming an interface between the first submodule and the second submodule. The interface permits a portion of light to pass therethrough so that the interface optically couples the first submodule and the second submodule. The optical coupling of the first submodule and the second submodule includes reducing reflection of the portion of light.

Certain embodiments making and using tandem photovoltaic devices can include the following aspects. The interface can include a first layer of the first submodule, the first layer being adjacent the second submodule, the first layer having a first surface, where the first surface can be polished to produce a roughness with a root mean square average of less than 170 nanometers. In other embodiments, the interface can include a first layer and also include a second layer of the first submodule interface, the first layer being adjacent the second layer and the second layer adjacent the second submodule, wherein the second layer of the interface is between the first layer and the second submodule. The first layer has a first surface, where the first surface has a defined surface roughness. In some embodiments, a mean square average of the first surface roughness is from about 50 nanometers to about 200 nanometers. In some embodiments, a root mean square average of the first surface roughness is from about 175 nanometers to about 200 nanometers. In some embodiments, a second layer of the first submodule interface can include at least one conductive layer and a transparent layer. In some embodiments, the second layer can be in contact with the first surface of the first layer. In some embodiments, the second layer can be positioned between the first layer and the second submodule and the first layer and the second layer can have an index of refraction mismatch of less than 0.2.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2:
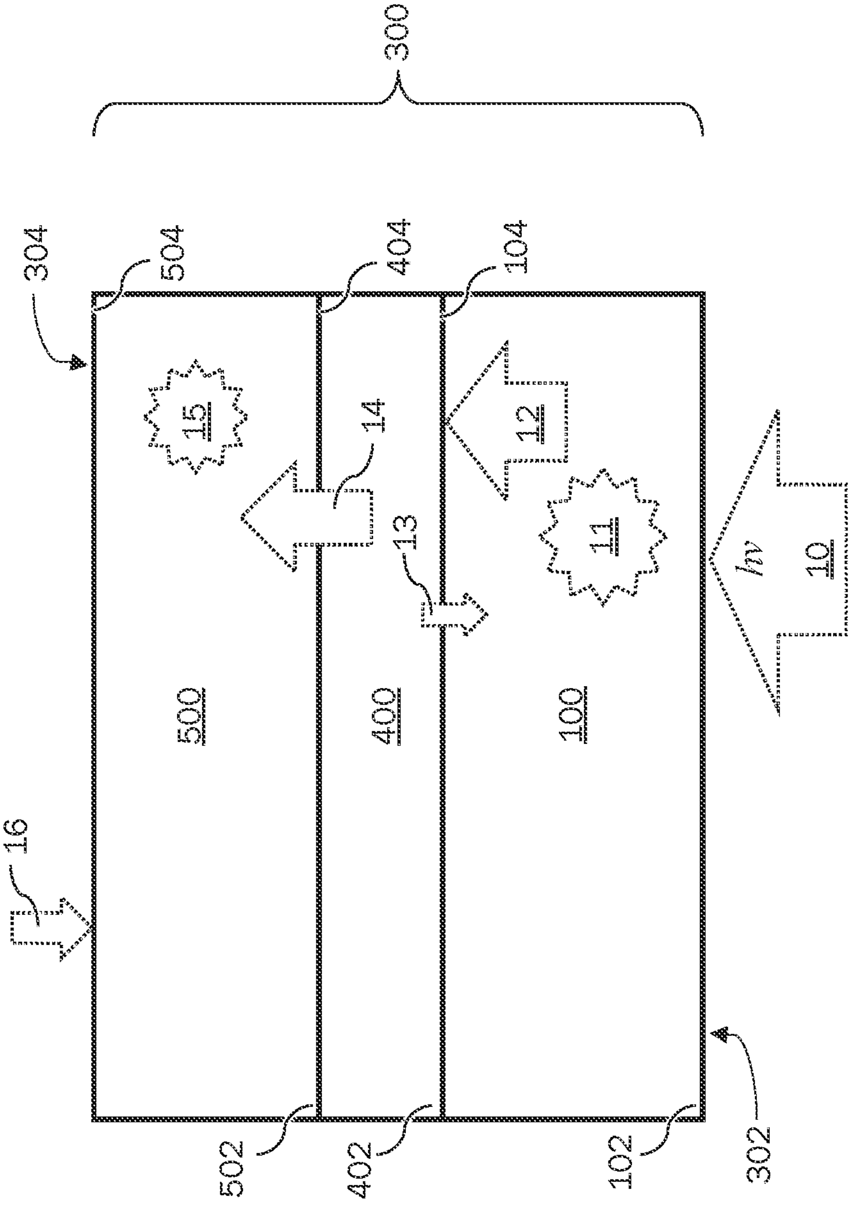

FIG. 2 schematically depicts a cross-sectional view of a tandem photovoltaic device according to one or more embodiments shown and described herein.

Figure 3:
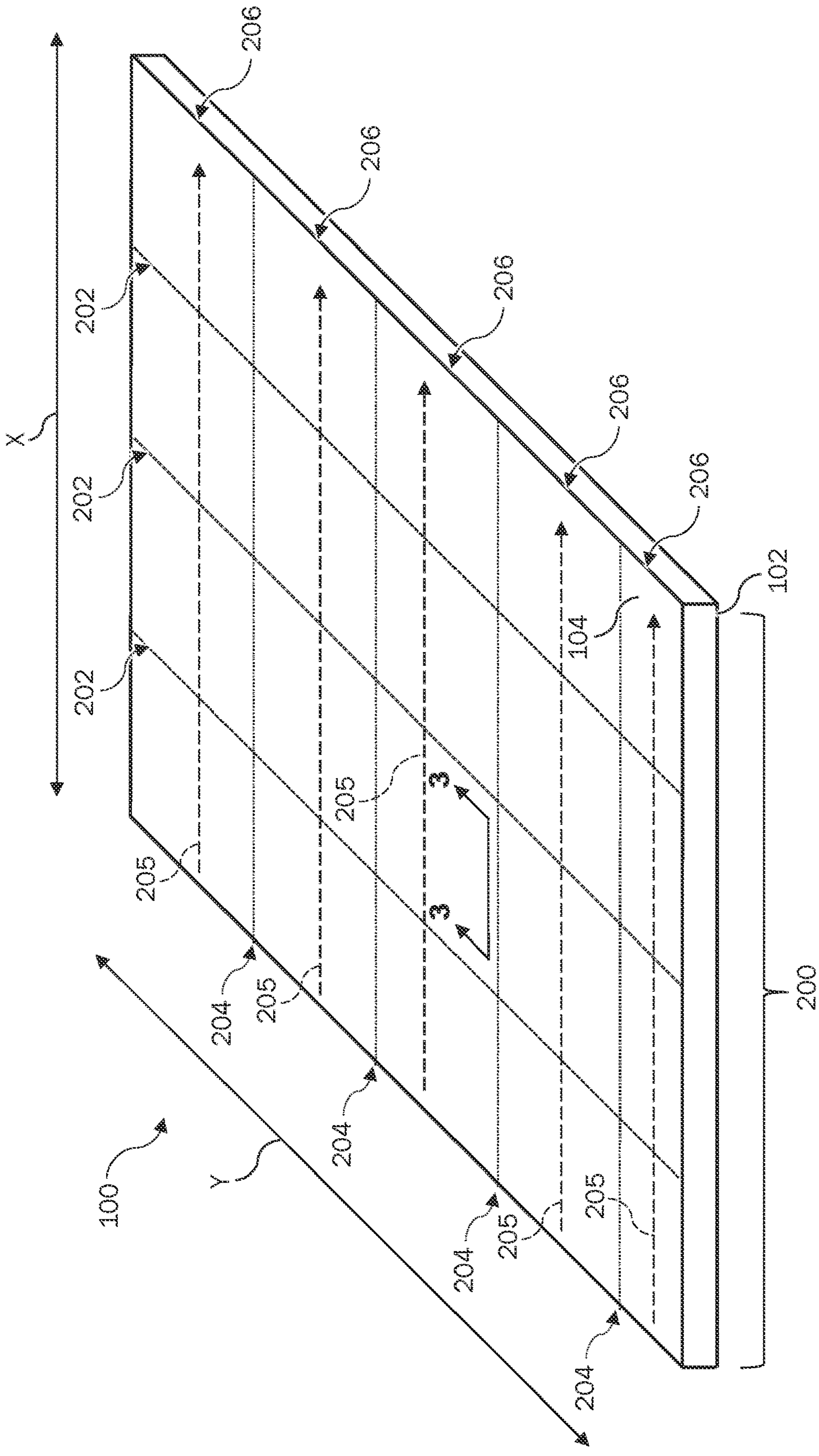

FIG. 3 schematically depicts an example submodule of the photovoltaic device of FIG. 1 according to one or more embodiments shown and described herein.

Figure 4:
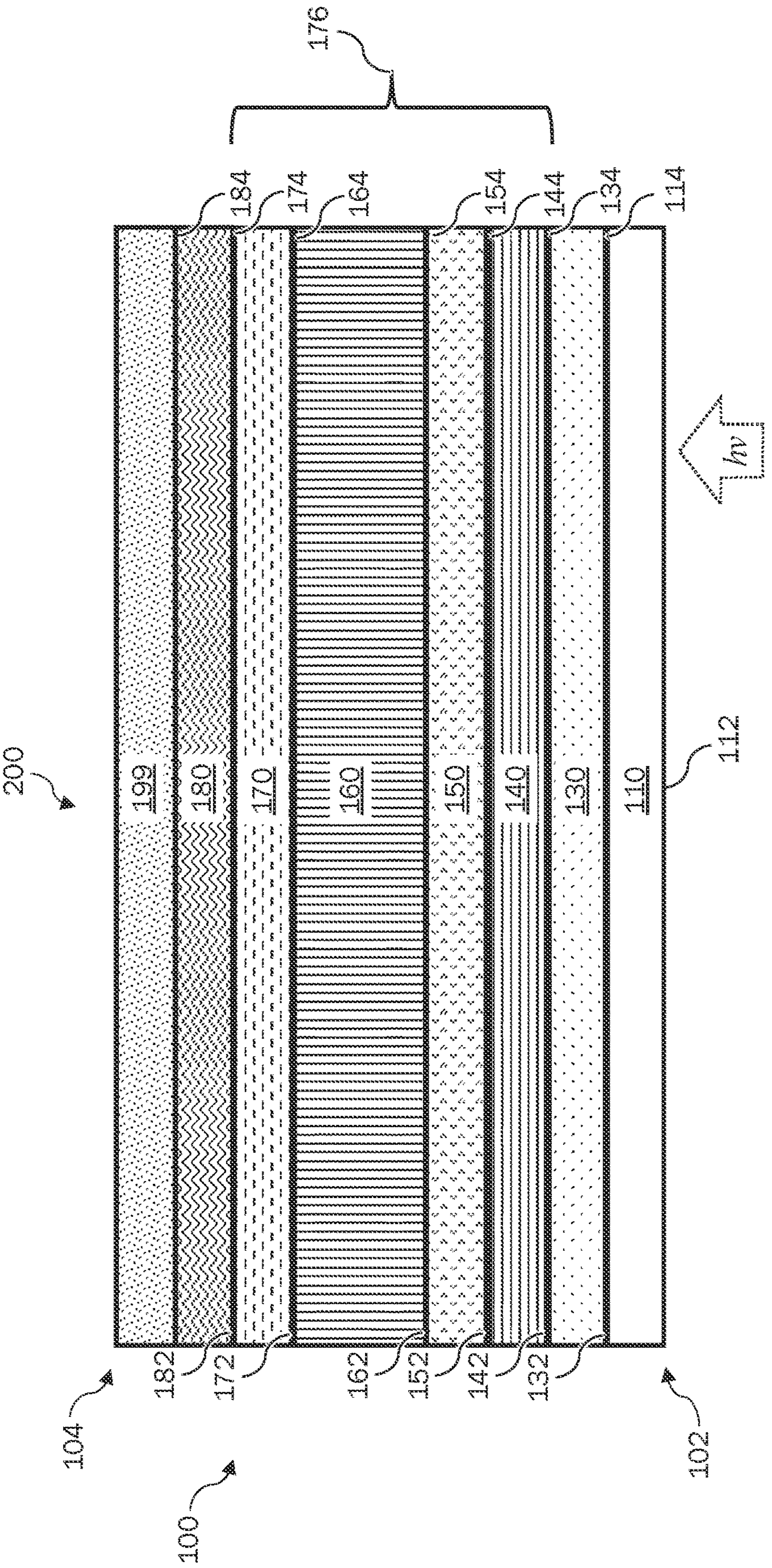

FIG. 4 schematically depicts a cross-sectional view along 3-3 of the photovoltaic submodule of FIG. 3 according to one or more embodiments shown and described herein.

Figure 5:
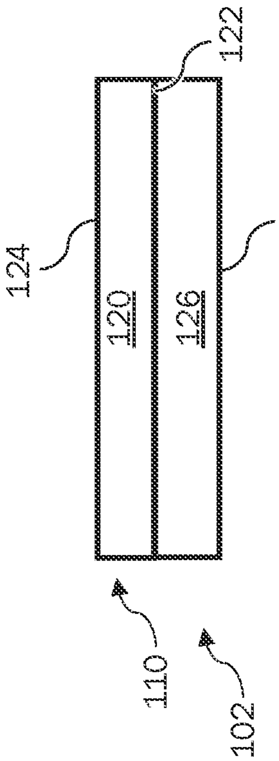

FIG. 5 schematically depicts a substrate according to one or more embodiments shown and described herein.

Figure 6:
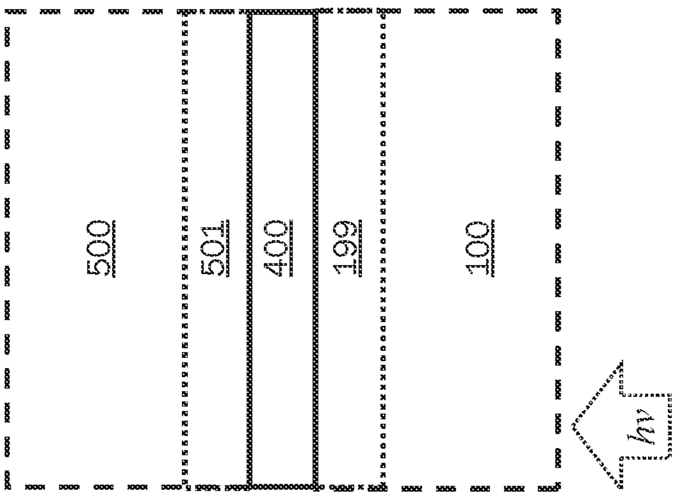

FIG. 6 schematically depicts a cross-sectional view of the tandem photovoltaic device of FIG. 1 according to one or more embodiments shown and described herein.

Figure 7B:
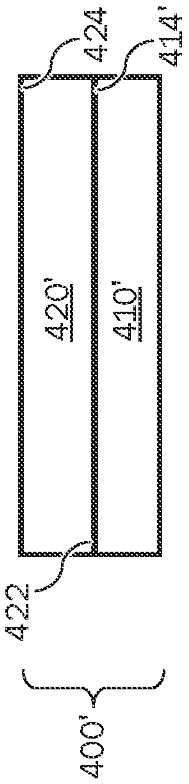
Figure 7A:
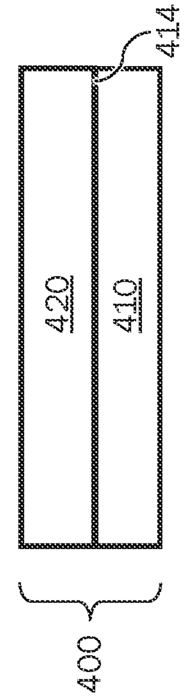

FIG. 7A schematically depicts a cross-sectional view of an example interface according to one or more embodiments shown and described herein.

FIG. 7B schematically depicts a cross-sectional view of another example interface according to one or more embodiments shown and described herein.

Figure 8:
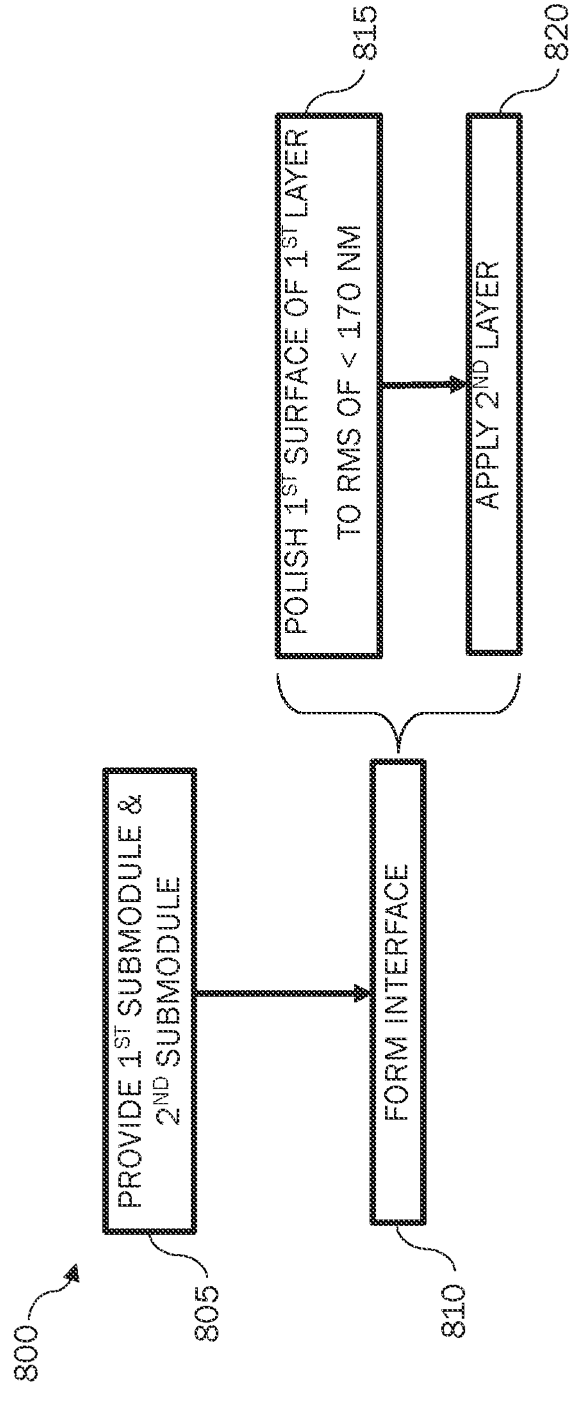

FIG. 8 depicts an example method of making a tandem photovoltaic device according to one or more embodiments shown and described herein.

Figure 9:
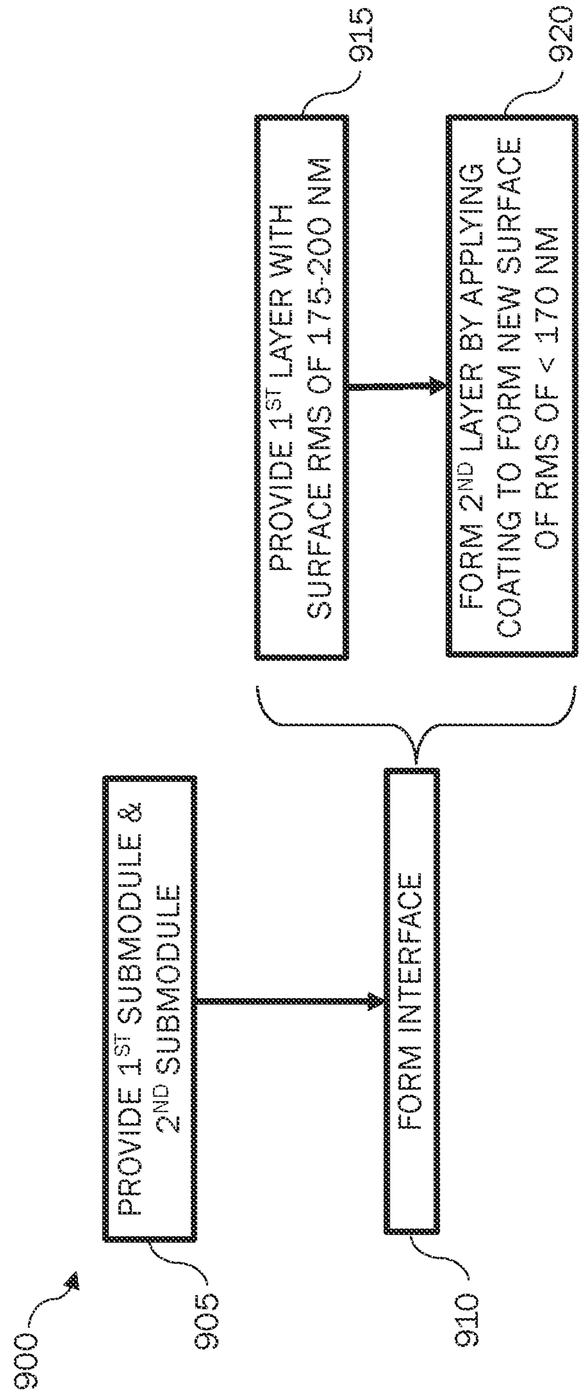

FIG. 9 depicts another example method of making a tandem photovoltaic device according to one or more embodiments shown and described herein.

DETAILED DESCRIPTION

The following description of technology is merely exemplary in nature of the subject matter, manufacture and use of one or more inventions, and is not intended to limit the scope, application, or uses of any specific invention claimed in this application or in such other applications as may be filed claiming priority to this application, or patents issuing therefrom. Regarding methods disclosed, the order of the steps presented is exemplary in nature, and thus, the order of the steps can be different in various embodiments, including where certain steps can be simultaneously performed, unless expressly stated otherwise. "A" and "an" as used herein indicate "at least one" of the item is present; a plurality of such items may be present, when possible. Except where otherwise expressly indicated, all numerical quantities in this description are to be understood as modified by the word "about" and all geometric and spatial descriptors are to be understood as modified by the word "substantially" in describing the broadest scope of the technology. "About" when applied to numerical values indicates that the calculation or the measurement allows some slight imprecision in the value (with some approach to exactness in the value; approximately or reasonably close to the value; nearly). If, for some reason, the imprecision provided by "about" and/or "substantially" is not otherwise understood in the art with this ordinary meaning, then "about" and/or "substantially" as used herein indicates at least variations that may arise from ordinary methods of measuring or using such parameters.

All documents, including patents, patent applications, and scientific literature cited in this detailed description are incorporated herein by reference, unless otherwise expressly indicated. Where any conflict or ambiguity may exist between a document incorporated by reference and this detailed description, the present detailed description controls.

Although the open-ended term "comprising," as a synonym of non-restrictive terms such as including, containing, or having, is used herein to describe and claim embodiments of the present technology, embodiments may alternatively be described using more limiting terms such as "consisting of" or "consisting essentially of." Thus, for any given embodiment reciting materials, components, or process steps, the present technology also specifically includes embodiments consisting of, or consisting essentially of, such materials, components, or process steps excluding additional materials, components or processes (for consisting of) and excluding additional materials, components or processes affecting the significant properties of the embodiment (for consisting essentially of), even though such additional materials, components or processes are not explicitly recited in this application. For example, recitation of a composition or process reciting elements A, B and C specifically envisions embodiments consisting of, and consisting essentially of, A, B and C, excluding an element D that may be recited in the art, even though element D is not explicitly described as being excluded herein.

As referred to herein, disclosures of ranges are, unless specified otherwise, inclusive of endpoints and include all distinct values and further divided ranges within the entire range. Thus, for example, a range of "from A to B" or "from about A to about B" is inclusive of A and of B. Disclosure of values and ranges of values for specific parameters (such as amounts, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that Parameter X may have a range of values from about A to about Z. Similarly, it is envisioned that disclosure of two or more ranges of values for a parameter (whether such ranges are nested, overlapping, or distinct) subsume all possible combination of ranges for the value that might be claimed using endpoints of the disclosed ranges. For example, if Parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, 3-9, and so on.

When an element or layer is referred to as being "on," "engaged to," "connected to," or "coupled to" another element or layer, it may be directly on, engaged, connected, or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer, or section. Terms such as "first," "second," and other numerical terms when used herein do not imply a sequence or order unless clearly indicated by the context. Thus, a first element, component, region, layer, or section discussed below could be termed a second element, component, region, layer, or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The term "light" can refer to various wavelengths of the electromagnetic spectrum such as, but not limited to, wavelengths in the ultraviolet (UV), infrared (IR), and visible portions of the electromagnetic spectrum. "Sunlight," as used herein, refers to light emitted by the sun.

The term "layer" can refer to a thickness of material provided upon a surface. The layer can cover all or a portion of the surface. A layer may include sublayers and can have compositional gradients within a layer. A layer can include one or more functional layers of material. A layer can extend across substantially all of a full width and length of a module. A layer can be intersected, for example, by scribing.

The present technology relates to tandem photovoltaic devices that include a first submodule and a second submodule. It should be recognized, however, that such tandem photovoltaic devices can include additional submodules as well as additional arrangements of submodules. In construction of the tandem photovoltaic devices, as disclosed herein, an interface is provided between the first submodule and the second submodule, where the interface permits a portion of light to pass therethrough. In this way, the interface optically couples the first submodule and the second submodule, thereby reducing reflection of the portion of light passing therethrough.

In particular, the interface can reduce reflection in comparison to a substantially identical arrangement of the first submodule and the second submodule, but without the interface positioned therebetween. Reflection, for example, can result in a portion of light passing through the first submodule to be reflected back to the first submodule instead of passing onto the second submodule. The interface can accordingly militate such light reflection and thereby improve the amount of light received by the second submodule. Reflection can also include undesired scatter and loss of polarization of the light, each of which can be minimized by the interface. The optical coupling provided by the interface can optimize the performance of the tandem photovoltaic device by allowing the respective submodules to receive portions of the light to which they are tailored and hence make more effective use of available light.

The tandem photovoltaic device can generate electrical power by converting light into direct current electricity using semiconductor materials that exhibit the photovoltaic effect. The photovoltaic effect generates electrical power upon exposure to light as photons are absorbed within the semiconductor material to excite electrons to a higher energy state. These excited electrons can move within the material, resulting in an electrical current. Semiconductor materials suitable for use in photovoltaic devices can include, for example, type II-VI materials (including cadmium telluride alloys), type I-III-VI materials (including CIGS and CIS materials), silicon, and perovskites.

Tandem photovoltaic devices can achieve higher total conversion efficiency than single photovoltaic devices by capturing a larger portion of the solar spectrum. Tandem devices can be formed with more than one p-n junction and with materials having different band-gap properties responsive to different ranges or portions of the electromagnetic spectrum, including infrared, visible, and ultraviolet light. In a device for which the primary light source is from above, a light-incident top cell, or upper submodule, can have a large band gap to capture energetic short wavelengths, while a bottom cell, or lower submodule, can use absorber materials having a smaller band gap to capture longer wavelengths and reflected photons. A tandem device can have two or more stacked sub-cells or submodules, and each submodule can include active regions formed from semiconductor materials having different absorptive properties, including different types of semiconductor materials.

Submodules in a tandem photovoltaic device, as described herein, can be stacked and separated by one or more interfaces. Incident electromagnetic radiation, or light, enters the device through a first submodule (e.g., a front cell or upper submodule). Light that is not absorbed by the first submodule reaches the interface. In certain embodiments, the interface can be configured to reflect some light energy, or photons, back into the first submodule, and also transmit photons of the light to a second submodule (e.g., a back cell or lower submodule). In most tandem devices, it is beneficial to minimize reflection of light passing through one submodule to another submodule. This is where optical coupling of the first and second submodules by the interface can have a substantive effect in performance of the tandem photovoltaic device. What is more, in photovoltaic devices having a plurality of stacked submodules, additional interfaces can be provided between each submodule. Tandem photovoltaic devices can also include bifacial devices, configured to receive incident radiation through both front and rear surfaces. Bifacial tandem devices can be configured to receive direct solar radiation on a top or front surface and receive radiation reflected from external surfaces, including a portion of light, such as visible and/or infrared light, on a back or rear surface. In such instances, the interface can militate reflection of light passing from the first submodule to the second submodule and vice versa.

A back surface of a typical thin film solar cell absorber film stack is relatively rough due to the granular structure of such absorbers. The roughness can range from approximately 175 nm to 200 nm root mean square (RMS) average and greater depending on the absorber grain size and deposition parameters. As described herein, roughness can be determined using laser confocal scanning microscopy (LCSM). Nanometer level data can be collected via LCSM and provided as RMS (Rq) or arithmetic average (Ra). An exemplary LCSM system is the laser scanning microscope—VK-X1000 by the Keyence Corporation of America of Itasca, IL, U.S.A.

Figure 1A:
FIG. 1A depicts a scanning transmission electron micrograph of a CdSeTe absorber stack cross section showing surface roughness.
Figure 1B:
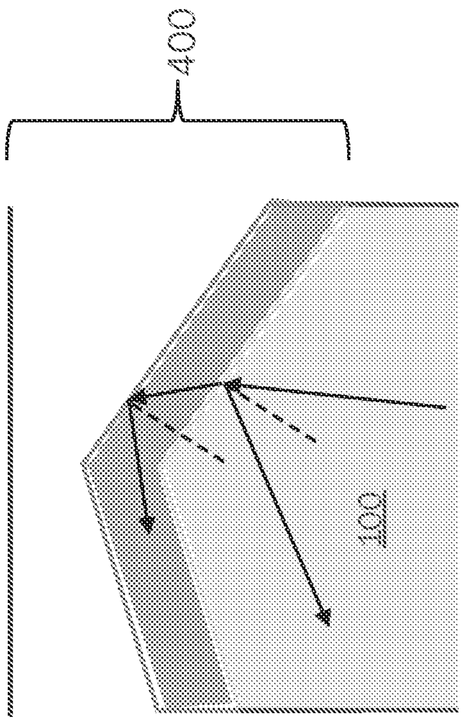
FIG. 1B depicts an optical diagram illustrating total internal reflection at rough surface "facets," such as those found in the roughness visible in FIG. 1A.

Applicants have discovered that this roughness can lead to increased optical reflectivity for light exiting the absorber. The reason for this is that refractive indices of materials used in thin film devices (e.g., absorber, back contact thin films) can be greater than refractive indices of typical conducting layers, such as transparent conductive oxides, or greater than refractive indices of a typical medium outside the cell, such as one or more polymer encapsulants or air. When such a high-low refractive index step is present, total reflection of light is possible at certain light incidence angles. The higher the surface roughness, the larger the local incidence angles of light at the rough surface, and consequently the larger the surface reflection, as illustrated by FIGS. 1A & 1B. Applicants have further discovered that the roughness of the absorber can influence the roughness of later applied layers. For example, the refractive indices of an absorber comprising CdTe can be substantially matched with a back contact comprising ZnTe. Accordingly, the interface between the absorber and back contact may exhibit little reflection. In some embodiments, the conducting layer can be formed from transparent materials such as, for example, conformal transparent conductive oxides. It can be challenging to match the refractive indices of such conformal transparent conductive oxides with the back contact and the absorber. Moreover, it can be challenging to match the refractive indices of such conformal transparent conductive oxides with encapsulant materials. Accordingly, both interfaces of the conducting layer can be susceptible to reflection. Embodiments of the present disclosure can reduce reflection at one or both of the interfaces of the conducting layer. For example, reduction of the roughness of the absorber layer can reduce the roughness of the subsequently applied layers, and reduce reflection.

A flat (e.g., substantially zero roughness) tandem top cell absorber can be transparent to sunlight with energies below the absorber bandgap energy. The light passing therethrough accordingly can reach the bottom cell of the tandem photovoltaic device. However, light at these energies can be partially reflected by a rough top cell back surface preventing it from reaching the bottom cell. The reflected light is subsequently not absorbed by the top cell absorber and is not converted to electrical energy so that overall tandem photovoltaic device performance is reduced. A rough surface of thin film solar cells absorber layer(s) therefore creates conditions for increased optical reflection and reduced tandem top cell transparency leading, in turn, to reduced tandem bottom cell performance.

To overcome issues related to such roughness and to improve the optical coupling between the cells or submodules of the tandem photovoltaic device, the present technology provides the present interface. The interface can reduce or minimize reflection by changing the structure between the respective submodules. Structural changes by the interface can include removal and/or alteration of surface structures as well as the addition of certain layers or coatings to maximize optical coupling of the submodules either side of the interface. Without wishing to be bound by theory, the combination of layers of material, with controlled roughness in the described ranges, can be beneficial in providing sufficient roughness to promote adhesion of adjacent layers, and can facilitate reflection or redirection of shorter wavelengths of light (for example, $\lambda \approx 400\text{-}800$ nm) back into the first submodule for absorption, while also providing surface roughness levels low enough to promote transmission of longer wavelengths of light (for example, $\lambda \approx 800\text{-}1200$ nm) through the interface, through any intervening layers, and into the second submodule.

In certain embodiments, the interface includes where the thin film tandem top cell is polished for reduced absorber back surface reflectivity and improved tandem bottom cell performance. The tandem thin film top cell can be polished after deposition of one of the absorber stack layers. For example, polishing can be performed after CdTe deposition and before transparent back contact deposition. Similarly, other thin film semiconductor materials (e.g. II-VI materials, I-III-VI materials, and perovskites) can be polished prior to transparent back contact deposition. Polishing can reduce reflection at the top cell back interface, improve optical coupling between the tandem top and bottom cells, and can increase tandem cell efficiency. In other words, polishing at the interface between the absorber and the back contact can improve the interfaces of the conducting layer. Polishing of the back surface of the absorber layer can include mechanical polishing techniques, chemical polishing techniques, as well as combinations of mechanical and chemical polishing techniques. For example, mechanical polishing can be performed by agitating a polishing pad in contact with the back surface of the absorber layer. Pressure can be applied to the polishing pad to remove material and reduce roughness. A slurry can be used during agitation. Optionally, the slurry can be chemically reactive with the surface. Inputs such as pad type, slurry composition, pressure, travel speed, rotational speed and the like can be controlled to achieve the desired roughness. Chemical polishing can be performed by applying a chemical solution to the back surface of the absorber layer. Material can be etched away to reduce roughness. Inputs such as solvent, reagent, solubility, concentration, time, temperature, activation time, and the like can be controlled to achieve the desired roughness.

In certain embodiments, the interface includes an optically-transparent, planarizing, index-matched coating that is deposited on the back surface of the tandem thin film top solar cell, where the coating can reduce the reflectivity of the interfaces of the top cell back conducting layer and hence improve tandem bottom cell performance. The coating can include an optical coating that is deposited on the surface of top cell stack, where coating can be selected and configured to exhibit certain effects. For example, the coating can planarize the top cell stack back surface so that surface roughness is reduced. The coating can have a refractive index substantially similar to that of the final top cell layer such as, for example, the conducting layer. The coating can also be transparent at energies less than the top cell absorber bandgap. Such coatings can reduce reflection at top cell back surface and thereby improve optical coupling between the tandem top and bottom cell and increase efficiency of the tandem photovoltaic device.

In certain embodiments, the coating used at the interface can include a titanium dioxide-based coating material. In some embodiments, a transparent coating layer can consist essentially of titanium dioxide. A coating material can include titanium dioxide mixed with a solvent during application, and can be highly-transparent and have refractive indices in a range from about 1.7 to about 2.3, depending on the manufacturing process. In some embodiments, the transparent coating layer can have a single index of refraction. In alternative embodiment, the coating material can have a graded index of refraction that changes between about 2.3 and about 1.7. Accordingly, the index of refraction can be graded to transition from the conducting layer to an encapsulant material. Such refractive indices can be substantially matched to typical thin film absorber layer indices. Surface planarization can be achieved by optimizing coating thickness and the coating deposition process. In some embodiments, an interface coating layer, or transparent layer, has a thickness greater than 50 nm, greater than 100 nm, greater than 150 nm, greater than 200 nm, greater than 250 nm, greater than 300 nm, greater than 400 nm, greater than 500 nm, or greater than 600 nm. In some embodiments, the transparent layer, has a thickness less than 2000 nm, less than 1800 nm, less than 1500 nm, less than 1250 nm, less than 1100 nm, less than 1000 nm, less than 900 nm, or less than 800 nm. Examples of coating deposition processes include wet coating methods, for example, spray-coating, roll-coating, slot-die coating, or spin-coating. Application of the coating material can be followed by drying and/or curing steps. In this way, the coating can directly contact the back surface of the top cell transparent conductor layer, engaging any roughness or surface micro/nano-structures, and when dried/cured can provide a new back surface that is effectively flat or smooth. Graded-index coatings can be applied as multiple coating layers with each layer having a different index of refraction. Substantially identical refractive indices between the transparent conductor layer and the coating provide an optimized transition of light through this new matched "bilayer," where the light exits the new back surface without the reflection previously exhibited by the roughness of the transparent conductor layer back surface alone. Accordingly, reflection at the interface between the top cell stack and the medium outside the cell, such as one or more polymer encapsulants or air, is reduced.

The present technology accordingly provides various ways to construct tandem photovoltaic modules that include a first submodule, a second submodule, and an interface between the first submodule and the second submodule. The interface can permit a portion of light to pass therethrough. The interface can optically couple the first submodule and the second submodule, thereby reducing reflection of the portion of light. The interface can be configured to optically couple the first submodule to the second submodule and transmit at least 60% of light having a wavelength from about 800 nm to about 1200 nm therethrough. For example, light passing through the first submodule can reach the interface, where the interface reduces reflection of light, allowing at least 60% of the light (k 800-1200 nm) to enter the second submodule. In some embodiments, the interface can be configured to optically couple the first submodule to the second submodule and transmit at least 90% of light having a wavelength from about 800 nm to about 1200 nm therethrough.

In certain embodiments, the interface can include the following aspects. The interface can include a first layer of the first submodule interface. The first layer can have a first surface having a roughness with a root mean square average of less than 170 nanometers. For example, the first surface having a roughness with a root mean square average of less than 170 nanometers can be the result of polishing of the first surface, including the use of mechanical and/or chemical polishing techniques. The interface can include a second layer of the first submodule interface, where the second layer can be in contact with the first surface of the first layer. The second layer can be positioned between the first layer and the second submodule. The first layer and the second layer can have an index of refraction mismatch of at least 0.75. The first layer can include an absorber layer having a group II-VI semiconductor, a group I-III-VI semiconductor, or a perovskite. The first layer can further include a back contact layer. The second layer can include a transparent layer. The second layer can also include a conducting layer, which can be transparent.

In certain embodiments, the interface can include the following aspects. The interface can include a first layer of the first submodule, where the first layer can be adjacent the second submodule. The first layer can have a first surface having a roughness with a root mean square average from about 50 nanometers to about 200 nanometers such as, for example, about 175 nanometers to about 200 nanometers. The interface can include a second layer of the first submodule, where the second layer can be in contact with the first surface of the first layer. The second layer can be between the first layer and the second submodule. The first layer and the second layer can have an index of refraction mismatch of less than 0.2. The second layer can include a first surface and a second surface, where the first surface of the second layer can be in contact with the first surface of the first layer. The second surface of the second layer can have a roughness with a root mean square average of less than 170 nanometers. The first layer can include an absorber layer having a thin film semiconductor (e.g., group II-VI) and the second layer can include a transparent layer. The transparent layer can include titanium dioxide.

The present technology further provides various methods of making a tandem photovoltaic device. Such methods include where a first submodule and a second submodule are provided, and an interface is formed between the first submodule and the second submodule. The interface can permit a portion of light to pass therethrough and thereby optically couple the first submodule and the second submodule. This optical coupling of the first submodule and the second submodule can include reducing reflection of the portion of light passing through the interface.

In certain embodiments, the method can include the following aspects. The interface can include a first layer of the first submodule, where the first layer can be adjacent the second submodule and the first layer can have a first surface. The first surface can be polished to produce a roughness with a root mean square average of less than 175 nanometers such as for example, less than 160 nanometers in one embodiment, less than 150 nanometers in another embodiment, less than 120 nanometers in a further embodiment, or less than 100 nanometers in still another embodiment, or less than 25 nanometers in still a further embodiment. Polishing of the first surface can include one or more mechanical polishing techniques and/or one or more chemical polishing techniques. The interface can include a second layer of the first submodule, with the second layer in contact with the first surface of the first layer, and where the second layer is between the first layer and the second submodule. The first layer and the second layer can have an index of refraction mismatch of at least 0.75. The first layer can include an absorber layer having a thin film semiconductor (e.g., group II-VI) and the second layer can include a transparent layer. The second layer can include a conducting layer. Optionally, the second layer can include a transparent layer, where the transparent layer can include titanium dioxide. For example, the transparent layer can be provided over the second surface of the conducting layer and between the conducting layer and an encapsulant.

In certain embodiments, the method can include the following aspects. The interface can include a first layer of the first submodule, with the first layer adjacent the second submodule, and where the first layer has a first surface having a roughness with a root mean square average from about 175 nanometers to about 200 nanometers. A second layer of the first submodule can be formed, where the second layer can be contact with the first surface of the first layer. The second layer can be between the first layer and the second submodule, where the first layer and the second layer have an index of refraction mismatch of less than 0.2. Forming the second layer of the first module can include applying a coating composition by one of spray coating, roll coating, and spin coating. The applied coating composition can be dried and/or cured. The second layer can include a first surface and a second surface, with the first surface of the second layer in contact with the first surface of the first layer, and where the second surface of the second layer has a roughness with a root mean square average of less than 25 nanometers. The first layer can include an absorber layer having a group II-VI semiconductor and the second layer can include a transparent layer, where the transparent layer can include titanium dioxide.

In certain embodiments, a tandem photovoltaic device comprises a first or top submodule and a second or bottom submodule. A plurality back layers of the top submodule produce a connective boundary region providing an interface to the second submodule. The boundary region of the first submodule can facilitate the transmission of infrared light therethrough. In some embodiments, the boundary region comprises the back or second surface of the absorber layer of the top module; a back contact layer; at least one conductive layer or transparent conductive oxide; and a transparent coating layer. An encapsulant interlayer may be provided between the boundary region and the second submodule.

In an example embodiment, the absorber layer and back contact have a refractive index of about 2.8; the conductive layer has a refractive index of about 1.8; and an encapsulant interlayer has a refractive index of about 1.5. In some embodiments, the conductive layer has an index of refraction mismatch to the absorber layer in a range of 0.75 to 1.0, and the conductive layer has a lower index of refraction than the absorber layer. In some instances, a transparent coating layer is provided over the conductive layer, and the transparent layer and the conductive layer have an index of refraction mismatch in a range of 0 to 0.2, and the transparent coating layer has a lower index of refraction than the conductive layer. In some instances, the transparent coating layer has an index of refraction in a range from 1.7 to 2.3.

In some embodiments, the second surface of the absorber layer has a roughness RMS value in a range of 50 nm to 200 nm. In some embodiments, an interface comprises a transparent layer or coating layer, wherein the coating layer comprises titanium dioxide and is provided over the absorber layer with a plurality of layers therebetween. In some instances, the coating layer has a thickness in a range of 100 nm to 1000 nm. In some instances, a top or first surface of the coating layer is provided within 600 nm of the back or second surface of the absorber layer. In some instances, a first surface of the coating layer is provided within 200 nm of the second surface of the back contact layer. In some instances, a first surface of the coating layer is provided on the second surface of the absorber layer, with a plurality of layers therebetween, whereby the first surface of the coating layer is separated from the second surface of the absorber layer by 150 nm to 650 nm. In some instances, the second or back surface of the coating layer has a roughness RMS value in a range of 50 to 170 nm.

In an example embodiment, the interface comprises: the second surface of the absorber layer of the first module, wherein the absorber is a II-VI semiconductor comprising cadmium and tellurium; a back contact layer on the absorber layer, wherein the back contact layer comprises zinc and tellurium; a barrier layer on the back contact layer, wherein the barrier layer comprises cadmium tin oxide; a conductive layer on the barrier layer, wherein the conductive layer comprises cadmium oxide; a cap layer on the conductive oxide layer, wherein the cap layer comprises cadmium tin oxide; and a planarizing and refractive index-matching layer or transparent coating layer on the cap layer, wherein the transparent coating layer comprises titanium dioxide.

The tandem photovoltaic device can be subjected to various finishing processing steps, such as adding further encapsulation layers, bussing, etc. to produce a finished tandem photovoltaic device.

Aspects of the present technology can apply in various combinations, interdependencies, and multiple dependencies, as set forth in the following instances.

Provided is a first instance of a tandem photovoltaic device comprising: a first submodule; a second submodule; an interface between the first submodule and the second submodule, wherein the interface permits a portion of light to pass therethrough, the interface optically coupling the first submodule and the second submodule, and optically coupling the first submodule and the second submodule includes reducing reflection of the portion of light.

Provided is a second instance of the first instance, wherein the interface includes a first layer of the first submodule, the first layer adjacent the second submodule, the first layer having a first surface, the first surface having a roughness with a root mean square average of less than 170 nanometers. Optionally, the first surface can have a roughness less than 160 nanometers. Optionally, the first surface can have a roughness less than 150 nanometers. Optionally, the first surface can have a roughness less than 120 nanometers. Optionally, the first surface can have a roughness less than 100 nanometers.

Provided is a third instance of the second instance, wherein the interface includes a second layer of the first submodule, the second layer in contact with the first surface of the first layer, the second layer between the first layer and the second submodule.

Provided is a fourth instance of the third instance, wherein the first layer and the second layer have an index of refraction mismatch of at least 0.75. The first layer can include an absorber layer, a back contact layer, or both. The second layer can include a conducting layer. The conducting layer can include one or more layers of conformal transparent conductive oxides.

Provided is a fifth instance of the third instance or the fourth instance, wherein the first layer includes an absorber layer having a group II-VI semiconductor and the second layer includes a transparent layer.

Provided is a sixth instance of the fifth instance, wherein the second layer includes a conducting layer.

Provided is a seventh instance of the first instance, wherein: the interface includes a first layer of the first submodule, the first layer adjacent the second submodule, the first layer having a first surface, the first surface having a roughness with a root mean square average of less than 170 nanometers; the interface includes a second layer of the first submodule, the second layer in contact with the first surface of the first layer, the second layer between the first layer and the second submodule; the first layer and the second layer have an index of refraction mismatch of at least 0.75; the first layer includes an absorber layer having a group II-VI semiconductor and the second layer includes a transparent layer; and the second layer includes a conducting layer.

Provided is an eighth instance of the first instance, wherein the interface includes: a first layer of the first submodule, the first layer adjacent the second submodule, the first layer having a first surface, the first surface having a roughness with a root mean square average from about 50 nanometers to about 200 nanometers; and a second layer of the first submodule, the second layer in contact with the first surface of the first layer, the second layer between the first layer and the second submodule, the first layer and the second layer having an index of refraction mismatch of less than 0.2.

Provided is a nineth instance of the eighth instance, wherein the second layer includes a first surface and a second surface, the first surface of the second layer in contact with the first surface of the first layer, the second surface of the second layer having a roughness with a root mean square average of less than 170 nanometers.

Provided is a tenth instance of the eighth instance or the nineth instance, wherein the first layer includes an absorber layer having a group II-VI semiconductor and the second layer includes a transparent layer.

Provided is an eleventh instance of the tenth instance, wherein the transparent layer includes titanium dioxide.

Provided is a twelfth instance of the first instance, wherein the interface includes: a first layer of the first submodule, the first layer adjacent the second submodule, the first layer having a first surface, the first surface having a roughness with a root mean square average from about 175 nanometers to about 200 nanometers; a second layer of the first submodule, the second layer in contact with the first surface of the first layer, the second layer between the first layer and the second submodule, the first layer and the second layer having an index of refraction mismatch of less than 0.2; the second layer includes a first surface and a second surface, the first surface of the second layer in contact with the first surface of the first layer, the second surface of the second layer having a roughness with a root mean square average of less than 25 nanometers; the first layer includes an absorber layer having a group II-VI semiconductor and the second layer includes a transparent layer; and the transparent layer includes titanium dioxide.

Provided is a thirteenth instance of one of the first instance through the twelfth instance, wherein the interface is configured to transmit at least 60% of light having a wavelength from about 800 nm to about 1200 nm passing therethrough.

Provided is a fourteenth instance of a method of making a tandem photovoltaic device, comprising: providing a first submodule and a second submodule; and forming an interface between the first submodule and the second submodule, wherein the interface permits a portion of light to pass therethrough, the interface optically coupling the first submodule and the second submodule, and optically coupling the first submodule and the second submodule includes reducing reflection of the portion of light.

Provided is fifteenth instance of the fourteenth instance, wherein: the interface includes a first layer of the first submodule, the first layer adjacent the second submodule, the first layer having a first surface; and forming the interface between the first submodule and the second submodule comprises polishing the first surface to produce a roughness with a root mean square average of less than 170 nanometers.

Provided is sixteenth instance of the fifteenth instance, wherein polishing the first surface to produce the roughness with the root mean square average of less than 170 nanometers includes a member selected from a group consisting of mechanically polishing the first surface, chemically polishing the first surface, and combinations thereof.

Provided is seventeenth instance of the sixteenth instance, wherein: the interface includes a second layer of the first submodule, the second layer in contact with the first surface of the first layer, the second layer between the first layer and the second submodule; the first layer and the second layer have an index of refraction mismatch of at least 0.75; the first layer includes an absorber layer having a group II-VI semiconductor and the second layer includes a transparent layer; and the second layer includes a conducting layer.

Provided is eighteenth instance of the fourteenth instance, wherein the interface includes: a first layer of the first submodule, the first layer adjacent the second submodule, the first layer having a first surface, the first surface having a roughness with a root mean square average from about 175 nanometers to about 200 nanometers; and forming the interface between the first submodule and the second submodule comprises forming a second layer of the first submodule, the second layer in contact with the first surface of the first layer, the second layer between the first layer and the second submodule, the first layer and the second layer having an index of refraction mismatch of less than 0.2.

Provided is nineteenth instance of the eighteenth instance, wherein forming the second layer of the first module includes applying a coating composition by one of spray coating, roll coating, slot die coating, and spin coating.

Provided is twentieth instance of the nineteenth instance, wherein: the second layer includes a first surface and a second surface, the first surface of the second layer in contact with the first surface of the first layer, the second surface of the second layer having a roughness with a root mean square average of less than 170 nanometers; the first layer includes an absorber layer having a group II-VI semiconductor and the second layer includes a transparent layer; and the transparent layer includes titanium dioxide.

EXAMPLES

Example embodiments of the present technology are provided with reference to the several figures enclosed herewith.

With reference to FIGS. 2 & 7, an embodiment of a tandem photovoltaic device 300 is shown. The tandem photovoltaic device 300 can be configured to receive light and transform light into electrical energy, as photons are absorbed from the light and transformed into electrical current via the photovoltaic effect. For sake of discussion and clarity, the tandem photovoltaic device 300 can define a front side 302 configured to face a primary light source such as, for example, the sun. Additionally, the tandem photovoltaic device 300 can also define a back side 304 offset from the front side 302 such as, for example, by a plurality of functional layers of material.

The tandem photovoltaic device 300 can have a first submodule 100, a second submodule 500, and an interface 400 therebetween. The first submodule 100 can also be termed a top cell or upper submodule. The second submodule 500 can also be termed a bottom cell or lower submodule. The interface 400 can include one or more treatments of, treated portions of, and/or one or more portions of the first submodule 100 and/or the second submodule 500, as well as stand-alone treatments, treated portions, and/or structures interposed between the first submodule 100 and the second submodule 500. In particular, the interface 400 permits a portion of light to pass therethrough from one of the first submodule 100 and the second submodule 500 to the other of the first submodule 100 and the second submodule 500. The interface 400 therefore optically couples the first submodule 100 and the second submodule 500 and reduces reflection of light through the interface 400. Each of the first submodule 100, the second submodule 500, and the interface 400 can comprise a plurality of layers. Each of the first and second submodules 100, 500 of the tandem photovoltaic device 300 can include one or more absorber layers for converting light into charge carriers, and conductive layers for collecting the charge carriers.

The first submodule 100 can have a first surface 102 substantially facing the front side 302 of the tandem photovoltaic device 300 and a second surface 104 substantially facing the back side 304 of the photovoltaic device 300. The interface 400 can have a first surface 402 substantially facing the front side 302 of the photovoltaic device 300 and a second surface 404 substantially facing the back side 304 of the photovoltaic device 300. The second submodule 500 can have a first surface 502 substantially facing the front side 302 of the photovoltaic device 300 and a second surface 504 substantially facing the back side 304 of the photovoltaic device 300.

As depicted in FIG. 2, incident light (hv) 10 can enter the front side 302 of the tandem photovoltaic device 300 through the first submodule 100 and a first portion 11 of light energy can be absorbed by the first submodule 100 and a remaining portion 12 of light energy can pass through the first submodule 100 to the interface 400. At the interface 400, reflected light 13 can be directed back toward the absorptive region of the first submodule 100 and transmitted light 14 can pass to the second submodule 500. However, the interface 400 is configured to particularly provide an optical coupling of the first and second submodules 100, 500 and thereby reduce the portion of reflected light 13 directed back toward the first submodule 100. The interface 400 can reduce the portion of reflected light 13 in comparison to a substantially identical arrangement of the first submodule 100 and the second submodule 500 that does not have the present interface 400 positioned therebetween.

Optionally, in a bifacial tandem device, back side light energy 16 can enter the back side 304 of the tandem photovoltaic device 300 toward the second submodule 500. In many implementations, back side light energy 16 can include externally reflected light and near infrared light. The first submodule can absorb the first portion 11 of light energy, which can include an absorbed combination of the incident light 10 and any reflected light 13 not minimized by the interface 400. The second submodule can absorb a second portion 15 of light energy comprising the transmitted light 14 and, optionally, the back side light energy 16. The interface 400 effectively increases the amount of the second portion 15 of light energy absorbed in the second submodule 500 by reducing the portion of reflected light 13.

Referring now to FIGS. 3 & 4, an example embodiment of the first submodule 100 of the tandem photovoltaic device 300 is shown. The first submodule 100 can include a plurality of layers disposed between the front side 102 and the back side 104. In some embodiments, the layers of the first submodule 100 can be divided into an array of photovoltaic cells 200. For example, the first submodule 100 can be scribed according to a plurality of serial scribes 202 and a plurality of parallel scribes 204. The serial scribes 202 can extend along a length Y of the first submodule 100 and demarcate the photovoltaic cells 200 along the length Y of the first submodule 100. Neighboring cells of the photovoltaic cells 200 can be serially connected along a width X of the first submodule 100. In other words, a monolithic interconnect of the neighboring cells 200 can be formed; e.g., adjacent to the serial scribe 202. The parallel scribes 204 can extend along the width X of the first submodule 100 and demarcate the photovoltaic cells 200 along the width X of the first submodule 100. Under operation, current 205 can predominantly flow along the width X through the photovoltaic cells 200 serially connected by the serial scribes 202. Under operation, parallel scribes 204 can limit the ability of current 205 to flow along the length Y. Parallel scribes 204 are optional and can be configured to separate the photovoltaic cells 200 that are connected serially into groups 206 arranged along length Y.

With particular reference to FIG. 3, the parallel scribes 204 can electrically isolate the groups 206 of photovoltaic cells 200 that are serially connected. In some embodiments, the groups 206 of the photovoltaic cells 200 can be connected in parallel such as, for example, via electrical bussing. Optionally, the number of parallel scribes 204 can be configured to limit a maximum current generated by each group 206 of the photovoltaic cells 200. In some embodiments, the maximum current generated by each group 206 can be less than or equal to about 200 milliamps (mA) such as, for example, less than or equal to about 100 mA in one embodiment, less than or equal to about 75 mA in another embodiment, or less than or equal to about 50 mA in a further embodiment.

With particular reference to FIG. 4, the layers of the first submodule 100 can include a thin film stack provided over a substrate 110. The substrate 110 can be configured to facilitate the transmission of light into the first submodule 100. The substrate 110 can be disposed at the front side 102 of the first submodule 100. Referring collectively to FIGS. 3 & 4, the substrate 110 can have a first surface 112 substantially facing the front side 102 of the first submodule 100 and a second surface 114 substantially facing the back side 104 of the first submodule 100. One or more layers of material can be disposed between the first surface 112 and the second surface 114 of the substrate 110.

Referring now to FIG. 5, the substrate 110 can include a transparent layer 120 having a first surface 122 substantially facing the front side 102 of the first submodule 100 and a second surface 124 substantially facing the back side 104 of the first submodule 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. The transparent layer 120 can have any suitable transmittance range, including about 250 nm to about 1,300 nm, in some embodiments. The transparent layer 120 can also have any suitable transmittance percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance, or more. Optionally, the substrate 110 can include a coating 126 applied to the first surface 122 of the transparent layer 120. The coating 126 can be configured to interact with light or to improve durability of the substrate 110 such as, but not limited to, an antireflective coating, an antifouling coating, or a combination thereof.

Referring again to FIG. 4, the first submodule 100 can include a barrier layer 130 configured to mitigate diffusion of contaminants (e.g., sodium) from the substrate 110, which could result in degradation or delamination of other layers of the photovoltaic stack. The barrier layer 130 can have a first surface 132 substantially facing the front side 102 of the first submodule 100 and a second surface 134 substantially facing the back side 104 of the first submodule 100. In some embodiments, the barrier layer 130 can be provided adjacent to the substrate 110. For example, the first surface 132 of the barrier layer 130 can be provided upon the second surface 114 of the substrate 110.

Generally, the barrier layer 130 can be substantially transparent, thermally stable, with a reduced number of pin holes, have high sodium-blocking capability, and good adhesive properties. Alternatively, or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 10 nanometers in one embodiment, more than about 15 nm in another embodiment, or less than about 20 nm in a further embodiment.

With continuing reference to FIG. 4, the first submodule 100 can include a transparent conductive oxide (TCO) layer 140 configured to provide electrical contact to transport charge carriers generated by the first submodule 100. The TCO layer 140 can have a first surface 142 substantially facing the front side 102 of the first submodule 100 and a second surface 144 substantially facing the back side 104 of the first submodule 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium tin oxide ($Cd_2SnO_4$). In embodiments where the TCO layer 140 comprises cadmium stannate, the cadmium stannate can be provided in a crystalline form. For example, the cadmium stannate can be deposited as a film and then subjected to an annealing process, which transforms the thin film into a crystallized film.

The first submodule 100 can include a buffer layer 150 configured to provide an insulating layer between the TCO layer 140 and any adjacent semiconductor layers. The buffer layer 150 can have a first surface 152 substantially facing the front side 102 of the first submodule 100 and a second surface 154 substantially facing the back side 104 of the first submodule 100. In some embodiments, the buffer layer 150 can be provided adjacent to the TCO layer 140. For example, the first surface 152 of the buffer layer 150 can be provided upon the second surface 144 of the TCO layer 140. The buffer layer 150 can include material having higher resistivity than the TCO later 140, including, but not limited to, intrinsic tin dioxide, zinc magnesium oxide (e.g., $Zn_{1-x}Mg_xO$), silicon dioxide ($SiO_2$), aluminum oxide ($Al_2O_3$), aluminum nitride (AlN), zinc tin oxide, zinc oxide, tin silicon oxide, or any combination thereof. In some embodiments, the material of the buffer layer 150 can be configured to substantially match the band gap of an adjacent semiconductor layer (e.g., an absorber). The buffer layer 150 can have a suitable thickness between the first surface 152 and the second surface 154, including, for example, more than about 10 nm in one embodiment, between about 10 nm and about 80 nm in another embodiment, or between about 15 nm and about 60 nm in a further embodiment.

Referring still to FIG. 4, the first submodule 100 can include an absorber layer 160 configured to cooperate with another layer and form a p-n junction within the first submodule 100. Accordingly, absorbed photons of the light can free electron-hole pairs and generate carrier flow, which can yield electrical energy. The absorber layer 160 can have a first surface 162 substantially facing the front side 102 of the first submodule 100 and a second surface 164 substantially facing the back side 104 of the first submodule 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 1.5 μm to about 4 μm in another embodiment.

The absorber layer 160 can be formed from a p-type semiconductor material having an excess of positive charge carriers, i.e., holes or acceptors. The absorber layer 160 can include a suitable p-type semiconductor material such as Group II-VI semiconductors, for example, cadmium and tellurium. Further examples of Group II-VI absorber materials include, but are not limited to, semiconductor materials comprising cadmium, zinc, tellurium, selenium, or any combination thereof. In some embodiments, the absorber layer 160 can include ternaries of cadmium, selenium, and tellurium (e.g., $CdSe_xTe_{1-x}$), or a compound comprising cadmium, selenium, tellurium, and one or more additional element (e.g., CdZnSeTe). The absorber layer 160 can further include one or more dopants. The first submodule 100 provided herein can include a plurality of absorber materials. In alternative embodiments, the absorber layer 160 can be formed from a group I-III-VI semiconductor, or a perovskite semiconductor material.

In embodiments where the absorber layer 160 comprises tellurium and cadmium, the average atomic percent of the tellurium in the absorber layer 160 can be greater than or equal to about 25 atomic percent and less than or equal to about 50 atomic percent such as, for example, greater than about 30 atomic percent and less than about 50 atomic percent in one embodiment, greater than about 40 atomic percent and less than about 50 atomic percent in a further embodiment, or greater than about 47 atomic percent and less than about 50 atomic percent in yet another embodiment. Alternatively, or additionally, average atomic percent of the tellurium in the absorber layer 160 can be greater than about 45 atomic percent such as, for example, greater than about 49 atomic percent in one embodiment. It is noted that the average atomic percent described herein is representative of the entirety of the absorber layer 160, the atomic percentage of material at a particular location within the absorber layer 160 can be graded through the thickness compared to the overall composition of the absorber layer 160. For example, the absorber layer 160 can have a graded composition.

In embodiments where the absorber layer 160 comprises selenium and tellurium, the average atomic percent of the selenium in the absorber layer 160 can be greater than 0 atomic percent and less than or equal to about 25 atomic percent such as, for example, greater than about 1 atomic percent and less than about 20 atomic percent in one embodiment, greater than about 1 atomic percent and less than about 15 atomic percent in another embodiment, or greater than about 1 atomic percent and less than about 8 atomic percent in a further embodiment. It is noted that the concentration of tellurium, selenium, or both can be graded through the thickness of the absorber layer 160. For example, when the absorber layer 160 includes a compound including selenium at a mole fraction of x and tellurium at a mole fraction of 1−x ($Se_xTe_{1-x}$), x can vary in the absorber layer 160 with distance from the first surface 162 of the absorber layer 160.

Referring still to FIG. 4, the absorber layer 160 can be doped with a dopant configured to manipulate the charge carrier concentration. In some embodiments, the absorber layer 160 can be doped with a Group VA (group 15) dopant such as, for example, arsenic, phosphorous, antimony, or a combination thereof. Alternatively, or additionally, the absorber layer 160 can be doped with a Group IB (group 11) dopant such as, for example, copper, silver, gold, or a combination thereof. The total density of the dopant within the absorber layer 160 can be controlled. Moreover, the amount of the dopant can vary with distance from the first surface 162 of the absorber layer 160.

FIG. 4 shows an example layer structure and compositions have been described with examples including Group II-VI materials. In other embodiments, the first submodule 100 of the tandem photovoltaic device 300 can use other photovoltaic materials in alternate layer structures to produce a photovoltaic submodule. In an example, the first submodule 100 can comprise a Group I-III-VI absorber material, such as, for example, copper indium gallium sulfide/selenide (CIGS), $CuInSe_2$ (CIS), or GaAs, and can be provided as a thin film. In another example, the first submodule 100 can comprise a perovskite absorber. In a further example, the first submodule 100 can include a silicon absorber, which can comprise amorphous, polycrystalline, crystalline, or thin film silicon.

According to the embodiments provided herein, the p-n junction can be formed by providing the absorber layer 160 sufficiently close to a portion of the first submodule 100 having an excess of negative charge carriers; e.g., electrons or donors. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

The first submodule 100 can include a back contact layer 170 configured to mitigate undesired alteration of the dopant and to provide electrical contact to the absorber layer 160. The back contact layer 170 can have a first surface 172 substantially facing the front side 102 of the first submodule 100 and a second surface 174 substantially facing the back side 104 of the first submodule 100. A thickness of the back contact layer 170 can be defined between the first surface 172 and the second surface 174. The thickness of the back contact layer 170 can be between about 5 nm to about 200 nm such as, for example, between about 10 nm to about 50 nm in one embodiment.

In some embodiments, the back contact layer 170 can be provided adjacent to the absorber layer 160. For example, the first surface 172 of the back contact layer 170 can be provided upon the second surface 164 of the absorber layer 160. In some embodiments, the back contact layer 170 can include combinations of materials from Groups I, II, VI, such as for example, one or more layers containing zinc and tellurium in various compositions. Further suitable materials include, but are not limited to, a bilayer of cadmium zinc telluride and zinc telluride, or zinc telluride doped with a Group V (group 15) dopant such as, for example, nitrogen. A thin film junction 176 can be defined as the thin film stack primarily contributing to the photovoltaic effect. For example, in some embodiments, the thin film junction 176 can include the transparent conductive oxide layer 140, the buffer layer 150, the absorber layer 160, the back contact layer 170, or combinations thereof.

Referring to FIG. 4, the first submodule 100 can include a conducting layer 180, which can be transparent and configured to provide electrical contact with the back contact layer 170, the absorber layer 160, or both. In some embodiments, the conducting layer 180 can be formed towards a back side of the first submodule 100 with respect to the absorber layer 160. In single junction devices, or when provided as a part of a lower or rear submodule (e.g., second submodule 500), the conducting layer 180 can be disposed at the back side of the submodule (e.g., second submodule 500) and can use opaque, non-transparent metal layers as constituents. However, non-transparent layers can be unsuitable for use as the conducting layer 180 of the first submodule 100, disposed between junctions in multi-junction photovoltaic devices or tandem photovoltaic devices. The conducting layer 180 can have a first surface 182 substantially facing the front side 102 of the first submodule 100 and a second surface 184 substantially facing the back side 104 of the first submodule 100. In some embodiments, the conducting layer 180 can be provided adjacent to the back contact layer 170 or the absorber layer 160. For example, the first surface 182 of the conducting layer 180 can be provided upon the second surface 174 of the back contact layer 170 or the second surface 162 of the absorber layer 160. A thickness of the conducting layer 180 can be defined between the first surface 182 and the second surface 184. The thickness of the conducting layer 180 can be less than about 500 nm such as, for example, between about 40 nm and about 400 nm in one embodiment, or between about 60 nm and about 350 nm.

Optionally, the first submodule 100 can have a back layer 199 at the back side 104 of the first submodule 100. The back surface of the back layer 199 defines the back surface 104 of the front submodule. In some embodiments, the back layer 199 comprises an electron reflector layer.

In alternative embodiments, the back layer 199 can be omitted, i.e., the function of the back layer 199 can be replaced by a region of the conducting layer 180. For example, the conducting layer 180 can operate as a transparent tunnel junction. The tunnel junction can have a p+ subregion and an n+ subregion. In some embodiments, the tunnel junction can have a p++ subregion and an n++ subregion. For example, the conducting layer 180 can have a transparent tunnel junction formed by a three layer stack of cadmium tin oxide, cadmium oxide, and cadmium tin oxide. Accordingly, the conducting layer 180 can be formed as a stack of conformal layers of transparent conductive oxides. As noted above, such transparent conductive oxides can have an index of refraction mismatch of at least 0.75 with the absorber layer 160, the back contact layer 170, or both.

Materials such as semiconductors and transparent conductive oxides can be doped with impurities to alter their electrical and optical properties. Dopants can be incorporated into functional layers to modify n-type or p-type charge carrier concentrations. Charge densities of greater than about $1\times10^{16}$ $cm^{-3}$ can be considered to be "+" type. Although the boundaries are not rigid, a material can be considered n-type if electron donor carriers are present in the range of about $1\times10^{11}$ $cm^{-3}$ to about $1\times10^{16}$ $cm^{-3}$, and n+ type if donor carrier density is greater than about $1\times10^{16}$ $cm^{-3}$. Similarly, a material is generally considered p-type if electron acceptor carriers (i.e., "holes") are present in the range of about $1\times10^{11}$ $cm^{-3}$ to about $1\times10^{16}$ $cm^{-3}$, and p+ type if acceptor carrier density is greater than about $1\times10^{16}$ $cm^{-3}$. The boundaries are not rigid and can overlap because a layer can be p+ relative to a layer that is p-type (or n+ relative to a layer that is n-type) if the carrier concentration is at least two orders of magnitude (i.e., 100-fold) higher, regardless of the absolute carrier density. Additionally, charge densities of greater than about $1\times10^{18}$ $cm^{-3}$ can be considered to be "++" type; and thus a layer of either n-type or p-type can be "++" relative to a layer of the same type that is itself "+" relative to yet a third layer, if the ++ layer has a same-type carrier density more than 100 fold that of the + layer.

Referring now to FIG. 2 and FIG. 6, the tandem photovoltaic device 300 includes a second submodule 500. The second submodule 500 can be disposed below or under the first submodule 100, referencing the front side 302 of the tandem photovoltaic device 300 as the primary light-facing top surface. The photovoltaic device submodule 500 can include a plurality of layers disposed between a first surface 502 on the front side of the second submodule 500 and a second surface on a back side of the second submodule 500. One or more of the plurality of layers can include a photovoltaic absorber material. In some embodiments, the layers of the photovoltaic device submodule 500 can be divided into a plurality of photovoltaic cells.

The second submodule 500 of the tandem photovoltaic device 300 can include one or more absorber materials in a layer structure. In an example, the second submodule 500 can comprise a silicon absorber, which can include amorphous, polycrystalline, crystalline, or thin film silicon. In another example, the second submodule 500 can comprise a perovskite absorber material. In a further example, the second submodule 500 can comprise a Group I-III-VI absorber material, such as, for example, copper indium gallium sulfide/selenide (CIGS), $CuInSe_2$ (CIS), or GaAs, and can be provided as a thin film. In another example, the second submodule 500 can comprise a Group II-VI absorber material, such as, for example, CdTe, CdZnTe, or CdSeTe.

The second submodule 500 can share various aspects with the first submodule 100. The second submodule 500 can have a front layer 501 at the front side 502 of the second submodule 500. The front surface of the front layer 501 can define the front surface 502 of the second submodule 500. In some embodiments, the front layer 501 is a buffer layer. In some embodiments, the front layer 501 is a conductive layer. In some embodiments, the front layer 501 includes a conductive metallic grid. In some embodiments, the front layer 501 comprises a transparent conductive oxide. In certain embodiments, a remainder or the entirety of the second submodule 500 can be configured identically or substantially identically to the first submodule 100. Embodiments of the second submodule 500 can include portions that are identical or substantially identical in function and structure to portions of the first submodule 100.

With continued reference to FIGS. 2 & 6, the tandem photovoltaic device 300 includes the interface 400 positioned between the first submodule 100 and the second submodule 500. It is understood, however, that one or more additional interfaces 400 can be positioned between additional submodules (e.g., second and third submodules, third and fourth submodules, etc.) of the tandem photovoltaic device 300. It is further understood that the interface 400 can include portions of the first submodule 100 and/or the second submodule 500, including adjacent layers of the first submodule 100 and/or the second submodule 500, as well as layers of the first submodule 100 and/or the second submodule 500 subject to certain treatments. Likewise, the interface 400 can include one or more layers or structures interposed between the first submodule 100 and the second submodule 500 not present in either of the first submodule 100 or the second submodule 500. Examples include where one or more of the absorber layer 160, the back contact layer 170, the conducting layer 180, and/or the back layer 199 form part of the interface 400, where such layers can be subjected to particular treatments and/or cooperate with additional layers, coatings, and materials in order to reduce reflection light passing between the first submodule 100 and the second submodule 500.

An example of an interface 400 structure is schematically depicted in a cross-section segment in FIG. 7A. The interface 400 includes a first layer 410 of the first submodule 100. The first layer 410 has a first surface 414. In some embodiments, first surface 414 has a roughness with a root mean square (RMS) average of less than 170 nanometers. In this example, the first layer 410 includes an absorber layer 160 of the first submodule 100. Optionally, the absorber layer 160 includes a group II-VI semiconductor. Formation of the absorber layer 160 can result in the first surface 414 originally being rough due to the granular structure of such thin film semiconductor material(s) used in the absorber layer 160. Accordingly, the original rough surface can be polished (e.g., mechanically and/or chemically polished) to form the first surface 414 having a roughness with a root mean square average of less than 170 nanometers. Specifically, the second surface 164 of the absorber layer 160 can be polished to reduce the roughness. As noted above, the second surface 164 of the absorber layer 160 can be polished to a roughness with an RMS average of less than 170 nanometers. Optionally, the second surface 164 of the absorber layer 160 can be polished to a roughness with an RMS average of less than 160 nanometers. Optionally, the second surface 164 of the absorber layer 160 can be polished to a roughness with an RMS average of less than 150 nanometers. Optionally, the second surface 164 of the absorber layer 160 can be polished to a roughness with an RMS average of less than 120 nanometers. Optionally, the second surface 164 of the absorber layer 160 can be polished to a roughness with an RMS average of less than 100 nanometers. According to the embodiments provided herein, the back contact 170 and the conducting layer 180 can be substantially conformal to the absorber layer. Accordingly, polishing the second surface 164 of the absorber layer 160 can reduce the roughness of the first surface 172 and the second surface 174 of the back contact layer 180. Additionally, polishing the second surface 164 of the absorber layer 160 can reduce the roughness of the first surface 182 and the second surface 184 of the conducting layer 180.

The example of the interface 400 shown in FIG. 7A includes a second layer 420, where the second layer 420 is in contact with the first surface 414 of the first layer 410. The second layer 420 is positioned between the first layer 410 and the second submodule 500. The second layer 420 can include a transparent layer, such as the back contact layer 170 of the first submodule 100. The second layer 420 can also include a conducting layer, such as the conducting layer 180 of the first submodule 100. As a result of the polishing of the second surface 164 of the absorber layer 160 (e.g., as the first surface 414 of the first layer 410) to now have an RMS of less than 170 nanometers, it is possible for the first layer 410 and the second layer 420 to have an index of refraction mismatch of at least 0.75, as the polished surface minimizes the amount of reflected light 13 directed back toward the first submodule 100.

The roughness of the first surface 414, prior to scribing or not including scribes, can be consistent across a full surface or span of the submodule. Submodules, as provided herein, can have a surface area greater than a square meter. A span of the first submodule can be greater than 0.5 m, greater than 0.8 m, equal to or greater than 1.0 m, equal to or greater than 1.2 m, less than 2.5 m, in a range of 0.5 m to 2.5 m, or in a range of 1.0 m to 2.0 m. In some embodiments, the roughness of the first surface 414, across the span of the first submodule has RMS surface roughness values in a range of 15 nm to 250 nm, in a range of 25 nm to 225 nm, in a range of 50 nm to 200 nm, in a range of 150 nm to 200 nm, in a range of 50 nm to 175 nm, in a range of 50 nm to 170 nm, in a range of 50 nm to 160 nm, in a range of 50 nm to 150 nm, in a range of 50 nm to 120 nm, or in a range of 50 nm to 100 nm.

Another example of an interface 400' structure is schematically depicted in a cross-section segment in FIG. 7B. The interface 400' includes a first layer 410' of the first submodule 100, where the first layer 410' is positioned adjacent the second submodule 500. The first layer 410' has a first surface 414' having a roughness with an RMS from about 175 nanometers to about 200 nanometers. In this example, the first layer 410' includes an absorber layer 160 of the first submodule 100, where the absorber layer 160 includes a group II-VI semiconductor. Formation of the absorber layer 160 can result in the first surface 414' being rough due to the granular structure of such material(s) used in the absorber layer 160.

The example of the interface 400' shown in FIG. 7B includes a second layer 420' of the first submodule 100, where the second layer 420' is in direct contact with the first surface 414' of the first layer 410'. The second layer 420' is positioned between the first layer 410' and the second submodule 500. The second layer 420' includes a first surface 422 and a second surface 424, where the first surface 422 of the second layer 420' is in contact with the first surface 414' of the first layer 410'. The second surface 424 of the second layer 420' has a roughness with an RMS of less than 170 nanometers. The first layer 410' and the second layer 420' have an index of refraction mismatch of less than 0.2. In this way, it is possible for the first layer 410' and the second layer 420' of the interface 400' to minimize the amount of reflected light 13 directed back toward the first submodule 100. The second layer 420' can include a transparent layer, which can include titanium dioxide. For example, the second layer 420' can be formed by a coating composition including the titanium dioxide that is coated onto the first layer 410'. Drying and/or curing of the coating composition can result in the second surface 424 being level and smooth, where the second surface 424 exhibits an RMS of between 25 nm and 200 nm, between 50 nm and 170 nm, or less than 25 nanometers.

The interface 400 can have an average transmittance greater than 20% for light having a wavelength between 800 nm and 1200 nm. Optionally, the interface 400 can have an average transmittance greater than about 25% for light having a wavelength 800 nm to 1200 nm such as, for example, greater than about 50% in one embodiment, or greater than about 60% in another embodiment, or greater than about 75% in a further embodiment.

With reference now to FIG. 8, one embodiment of a method of making the tandem photovoltaic device 300 is shown at 800. A first step at 805 can include providing the first submodule 100 and the second submodule 500. A second step at 810 can include forming the interface 400 between the first submodule 100 and the second submodule 500, where the interface 400 includes a first layer 410 of the first submodule 100, the first layer 410 adjacent the second submodule 500, the first layer 410 having a first surface 414. Forming the interface 400 at 810 can include a third step 815 of polishing the first surface to produce a roughness with a root mean square average of less than 25 nanometers and a fourth step 820 of applying a second layer 420 of the first submodule 100, the second layer 420 in contact with the first surface 414 of the first layer 410, the second layer 420 between the first layer 410 and the second submodule 500. Polishing of the first surface 414 in the third step 815 can include mechanical and/or chemical polishing techniques. In this way, the first layer 410 and the second layer 420 can have an index of refraction mismatch of at least 0.75 while the polished first surface 414 minimizes the amount of reflected light 13 directed back toward the first submodule 100.

With reference now to FIG. 9, another embodiment of a method of making a tandem photovoltaic device 300 is shown at 900. A first step at 905 can include providing a first submodule 100 and a second submodule 500. A second step at 910 can include forming the interface 400' between the first submodule 100 and the second submodule 500. Forming the interface 400' at 910 can include a third step 915 of providing a first layer 410' of the first submodule 100, the first layer 410' adjacent the second submodule 500, the first layer 410' having a first surface 414', the first surface 414' having a roughness with a root mean square average from about 50 nanometers to about 200 nanometers. Forming the interface 400' at 910 can further include a fourth step 920 of forming a second layer 420' of the first submodule 100, the second layer 420' in contact with the first surface 414' of the first layer 410', the second layer 420' between the first layer 410' and the second submodule 500, the first layer 410' and the second layer 420' having an index of refraction mismatch of less than 0.2, where the second layer 420' can be formed by applying a coating composition by one of spray coating, roll coating, and slot die coating. The second layer 420' can include a transparent layer, where the coating composition used to form such can include titanium dioxide. Optionally, the coating composition may be dried to remove one or more solvents and may be heat cured.

In a layer-forming step of an example method, a deposition assembly can deliver a substantially uniform layer or coating simultaneously along a width of a substrate. The deposition assemblies provided herein are scalable to coat large substrates, for example, substrates having dimensions greater than or equal to about 1 m in length and/or width, in a range between 0.5 to 2.0 m in length and width, or up to about 2 m in length and/or width. A width may be measured across a dimension perpendicular to an edge and perpendicular to a direction of conveyance during a manufacturing process. The deposition assembly can be located above a conveyor so as to deposit the material on an upwardly facing surface of a substrate, layer stack, or partially-formed device. The conveyor can be of the roll-type including rolls that support a downwardly facing surface of the substrate for its conveyance during layer formation and processing. Processing can include transporting the substrates through a plurality of deposition and processing stations to form layers of the layer stack on the substrate. In an example, a transparent coating is applied over previously deposited layers as a substrate moves past a deposition assembly, and subsequently the transparent coating is dried and cured as it passes a processing station.

TEST EXAMPLES

TABLE 1

| | Rq (nanometers) | % Improvement |
|---|---|---|
| Comparative Example | 185.8 | N/A |
| Example 1 | 116.8 | 15.2% |
| Example 2 | 129.5 | 13.0% |
| Example 3 | 165 | 7.1% |
| Example 4 | 112.6 | 14.7% |
| Example 5 | 136.8 | 9.8% |
| Example 6 | 153.1 | 5.8% |
| Example 7 | 161.2 | 4.7% |
| Example 8 | 126 | 11.4% |
| Example 9 | 135.2 | 10.8% |
| Example 10 | 164.3 | 3.1% |
| Example 11 | 154.6 | 6.8% |
| Example 12 | 157.4 | 4.9% |
| Example 13 | 167.2 | 3.2% |
| Example 14 | 166.2 | 6.2% |
| Example 15 | 97.3 | 19.7% |
| Example 16 | 90.3 | 17.1% |
| Example 17 | 53.9 | 26.3% |

Table 1 provides a summary of various experimental embodiments according to the present disclosure. The Comparative Example and Examples 1-17 were all prepared from the same stack of materials. Specifically, a glass substrate was coated with a front contact material, which included a layer of fluorine doped tin oxide. The front contact material was coated with a CdSeTe absorber layer. The absorber layer was coated with a conductive layer from a trilayer stack of cadmium tin oxide, cadmium oxide, and cadmium tin oxide. Each of the Comparative Example and Examples 1-17 were prepared as similar as possible aside from the polish applied to the back surface of the absorber layer, i.e., the interface between the absorber layer and the conductive layer. The Comparative Example was not polished. The back surface of the absorber layers of each of Examples 1-17 were mechanically polished to varying levels of roughness. The RMS (Rq) values were determined using LCSM and are summarized in Table 1. The amount of light at 1,000 nanometer wavelength transmitted through each stack was determined for Comparative Example and Examples 1-17. Table 1 summarizes the relative improvement in percentage of light transmitted through Examples 1-17 relative to the Comparative Example.

As provided in Table 1, reduction in RMS average corresponds strongly with an increase in transmission. Specifically, a reduction to a roughness with an RMS average of less than 160 nanometers yielded about a 5% improvement in transmission (See Examples 6, 11 and 12). Reduction to a roughness with an RMS average of less than 120 nanometers yielded about a 15% improvement in transmission (See, Examples 1 and 4). Reduction to a roughness with an RMS average of less than 100 nanometers yielded about a 19% improvement in transmission (See, Examples 15 and 16).

It is noted that certain layers were omitted from the tested stack for ease of completion of experiments. Specifically, the back contact layer was not placed between the absorber layer and conducting layer. Testing of multilayer back contacts indicates substantial alignment between absorber surface and back contact surface conformality. Generally, the back contact layer (e.g., ZnTe) can be substantially conformal with and can have a refractive index substantially similar to the absorber layer. Accordingly, the results of Table 1 are indicative of the improvements for a device with a back contact layer. It is anticipated that device performance can remain consistent or increase with the addition of an encapsulant. Specifically, the conductive layer and transparent layer can be substantially conformal and have improved roughness at an interface with the encapsulant. As most encapsulant materials are not refractive index matched to the conductive layer, it is believed that transmissions will be improved relative to the Comparative Example.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. Equivalent changes, modifications and variations of some embodiments, materials, compositions and methods can be made within the scope of the present technology, with substantially similar results.

What is claimed is:

1. A tandem photovoltaic device comprising:

a first submodule, a second submodule over the first submodule, and an interface between the first submodule and the second submodule, wherein:

the interface permits a portion of light to pass therethrough, the interface optically couples the first submodule and the second submodule, and the interface comprises:

an absorber layer formed from a thin film semiconductor, the absorber layer having a surface having a roughness with a root mean square average from 50 nanometers to 200 nanometers;

a conductive layer over the surface of the absorber layer; and a transparent coating layer over the conductive layer, the transparent coating layer including a back surface having a surface roughness less than the roughness of the absorber surface, and wherein the transparent coating layer is between the absorber layer and the second submodule; whereby the interface transmits at least 60% of light having a wavelength from about 800 nm to about 1200 nm therethrough.

2. The tandem photovoltaic device of claim 1, wherein the thin film semiconductor is a II-VI material, I-III-VI material, or a perovskite.

3. The tandem photovoltaic device of claim 1, wherein the conductive layer comprises a transparent conductive oxide, and the conductive layer has an index of refraction mismatch of at least 0.75 to the absorber layer.

4. The tandem photovoltaic device of claim 3, wherein the transparent conductive oxide is cadmium tin oxide.

5. The tandem photovoltaic device of claim 3, wherein the transparent conductive oxide is cadmium oxide.

6. The tandem photovoltaic device of claim 1, wherein the conductive layer comprises a plurality of layers, wherein the plurality of layers includes: a layer of cadmium tin oxide, and a layer of cadmium oxide.

7. The tandem photovoltaic device of claim 1, wherein the conductive layer comprises a transparent tunnel junction.

8. The tandem photovoltaic device of claim 1, comprising a back contact layer over the surface of the absorber layer and between the absorber layer and the conductive layer.

9. The tandem photovoltaic device of claim 8, wherein the back contact layer comprises ZnTe.

10. The tandem photovoltaic device of claim 1, wherein the root mean square average of the surface roughness of the absorber layer is less than 170 nanometers.

11. The tandem photovoltaic device of claim 1, wherein the root mean square average of the surface roughness of the absorber layer is less than 160 nanometers, less than 150 nanometers, or less than 120 nanometers.

12. The tandem photovoltaic device of claim 1, wherein the root mean square average of the surface of the absorber layer is less than 100 nanometers.

13. The tandem photovoltaic device of claim 1, wherein the root mean square average of the surface roughness of the absorber layer is from 175 nanometers to 200 nanometers.

14. The tandem photovoltaic device of claim 1, wherein the transparent coating layer comprises titanium dioxide.

15. The tandem photovoltaic device of claim 1, wherein the transparent coating layer and the conductive layer have an index of refraction mismatch of less than 0.2.

16. The tandem photovoltaic device of claim 1, wherein the transparent coating layer has an index of refraction from 1.7 to 2.3.

17. The tandem photovoltaic device of claim 1, wherein the transparent coating layer has a graded index of refraction.

18. The tandem photovoltaic device of claim 1, wherein the transparent coating layer has a thickness in a range of 100 nm to 1000 nm.

19. A tandem photovoltaic device comprising:

a first submodule;

a second submodule over the first submodule, and an interface between the first submodule and the second submodule, wherein:

the interface permits a portion of light to pass therethrough, the interface optically couples the first submodule and the second submodule, and the interface comprises:

an absorber layer formed from a thin film semiconductor, the absorber layer having a surface having a roughness with a root mean square average in a range of 150 nanometers to 200 nanometers;

a conductive layer over the surface of the absorber layer, wherein the conductive layer has an index of refraction mismatch of at least 0.75 to the absorber layer; and a transparent coating layer over the conductive layer, the transparent coating layer including a back surface having a surface roughness less than the roughness of the absorber surface, and wherein the transparent coating layer is in direct contact with the conductive layer, and wherein the transparent coating layer is between the absorber layer and the second submodule.

* * * * *